(12) United States Patent
Morrow et al.

(10) Patent No.: US 6,448,177 B1
(45) Date of Patent: Sep. 10, 2002

(54) METHOD OF MAKING A SEMICONDUCTOR DEVICE HAVING A DUAL DAMASCENE INTERCONNECT SPACED FROM A SUPPORT STRUCTURE

(75) Inventors: Patrick Morrow; Xiaorong Morrow, both of Portland, OR (US)

(73) Assignee: Intle Corporation, Santa Clara, CA (US)

( * ) Notice: Subject to any disclaimer, the term of this patent is extended or adjusted under 35 U.S.C. 154(b) by 0 days.

(21) Appl. No.: 09/819,881

(22) Filed: Mar. 27, 2001

(51) Int. Cl.[7] .................. H01L 21/331; H01L 21/76; H01L 21/4763; H01L 21/44
(52) U.S. Cl. .................. 438/638; 438/319; 438/411; 438/619; 438/687
(58) Field of Search .................. 438/319, 411, 438/421, 422, 619, 637–641, 622–624, 672, 675, 687, 688

(56) References Cited

U.S. PATENT DOCUMENTS

| | | | | |
|---|---|---|---|---|
| 5,510,645 A | * | 4/1996 | Fitch et al. .................. | 257/522 |
| 5,567,982 A | * | 10/1996 | Bartelink .................. | 257/664 |
| 5,882,963 A | * | 3/1999 | Berber et al. .................. | 438/195 |
| 6,153,511 A | * | 11/2000 | Watatani .................. | 438/623 |
| 6,218,302 B1 | * | 4/2001 | Braeckelmann et al. .... | 438/687 |

* cited by examiner

Primary Examiner—Ha Tran Nguyen
(74) Attorney, Agent, or Firm—Mark V. Seeley

(57) ABSTRACT

A semiconductor device and an improved method for making it are described. The semiconductor device comprises a dual damascene interconnect that includes a conductive line. The device further includes a support structure that is spaced from the conductive line, and an insulating layer that is formed on the support structure and the conductive line. In the method for forming that device, a support structure is formed on a substrate, and an insulating layer is formed adjacent to it. Portions of the insulating layer are removed to form a via and a trench, which are filled with a conductive material to generate a dual damascene interconnect that includes a conductive line, wherein the conductive line is spaced from the support structure.

8 Claims, 8 Drawing Sheets

METHOD OF MAKING A SEMICONDUCTOR DEVICE HAVING A DUAL DAMASCENE INTERCONNECT SPACED FROM A SUPPORT STRUCTURE

FIELD OF THE INVENTION

The present invention relates to semiconductor devices that include dual damascene interconnects and methods for making them.

BACKGROUND OF THE INVENTION

Dual damascene interconnects may enable reliable low cost production of integrated circuits using sub 0.25 micron process technology. As device features shrink, however, the distance between conductive lines decreases, creating the need for a dielectric with a lower dielectric constant. Certain low-k materials have been proposed, including various carbon containing materials, e.g., organic polymers and carbon doped oxides. Although such materials may serve to lower the dielectric constant, they may offer inferior mechanical properties, such as poor mechanical strength or susceptibility to cracking.

Accordingly, there is a need for a semiconductor device that includes a dual damascene interconnect in which the dielectric that insulates adjacent conductive lines has both a low dielectric constant and acceptable mechanical characteristics. In addition, there is a need for a process for making such a device. The present invention provides such a semiconductor device and a process for making it.

DETAILED DESCRIPTION OF THE PRESENT INVENTION

A semiconductor device is described. That device comprises a dual damascene interconnect, which is formed on a substrate, that includes a conductive line. A support structure is formed on the substrate, which is spaced from the conductive line, and an insulating layer is formed on top of the support structure and the conductive line.

A method for forming a semiconductor device is also described. That method comprises forming a support structure on a substrate, the support structure having a first dielectric constant. An insulating layer is formed adjacent to the support structure, the insulating layer having a second dielectric constant, the second dielectric constant being less than the first dielectric constant. Parts of the insulating layer are removed to form a via and a trench, which are filled with a conductive material. This generates a dual damascene interconnect comprising a conductive line, wherein the conductive line is spaced from the support structure.

Set forth below is a description of a number of embodiments of the semiconductor device and method of the present invention. In the following description, numerous specific details are presented such as material types, process steps, etc., to provide a thorough understanding of the present invention. However, it will be apparent to those skilled in the art that the invention may be practiced in many ways other than those expressly described here. The invention is thus not limited by the specific details disclosed below.

Figure 1:
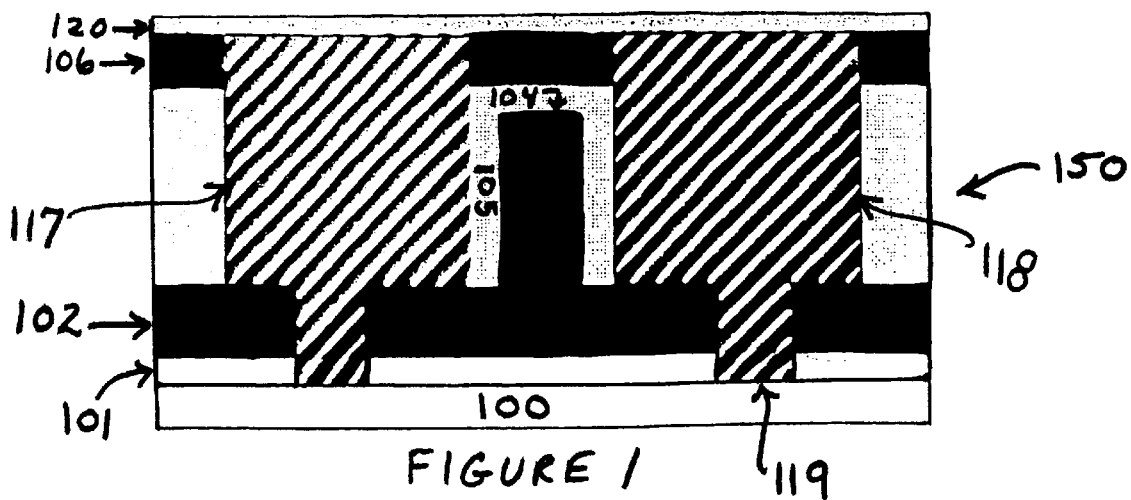
FIG. 1 illustrates a cross-section of an embodiment of the semiconductor device of the present invention.

FIG. 1 illustrates a cross-section of an embodiment of semiconductor device 150 of the present invention. That embodiment includes a dual damascene interconnect 117 that includes conductive line 118 and via 119. Via 119 couples line 118 to substrate 100. Supporting line 118 is first insulating layer 102, which lies upon barrier layer 101. Barrier layer 101 may be formed from a material that can serve as an etch stop and/or serve to prevent diffusion of material from substrate 100 into interconnect 117. Layer 102 may serve to insulate line 118 from substrate 100.

Formed between conductive lines 118 is support structure 104. In this embodiment, that structure takes the form of a pillar or column. Pillar 104 is separated from lines 118 by second insulating layer 105. Layer 105 is made from a material that has a relatively low dielectric constant, when compared to the dielectric constant for the material used to make pillar 104. Pillar 104 is made from a material that has superior mechanical properties, when compared to those of the material used to make layer 105. As a result, semiconductor device 150 includes a dual damascene interconnect that borders a low-k dielectric, which also shows enhanced mechanical properties.

Formed on layer 105 are hard masking layer 106 and second barrier layer 120. Hard masking layer 106 comprises remnants of a hard mask that had been used in a process for making interconnect 117. Barrier layer 120 enables a similar dual damascene interconnect structure to be built on top of the FIG. 1 structure. In this regard, a completed semiconductor device may include multiple dual damascene structures, like the one shown here, one stacked on top of the other, to provide the resulting interconnect for the device.

Figure 2:
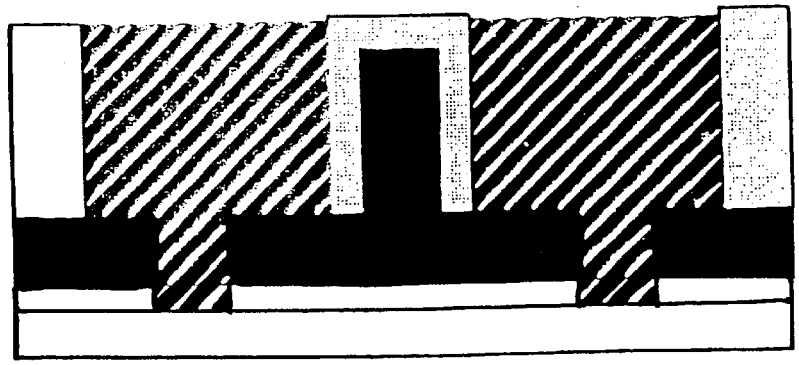
FIG. 2 illustrates a cross-section of a second embodiment of the semiconductor device of the present invention.

FIG. 2 illustrates a cross-section of a second embodiment of the semiconductor device of the present invention. That embodiment is similar to the one shown in FIG. 1, except that it lacks masking layer 106—which was not used in the method of forming this structure—and lacks barrier layer 120. Like the FIG. 1 embodiment, a completed semiconductor device may include a stack of several structures, like the one shown here, which provide the device's interconnect.

Figure 3:
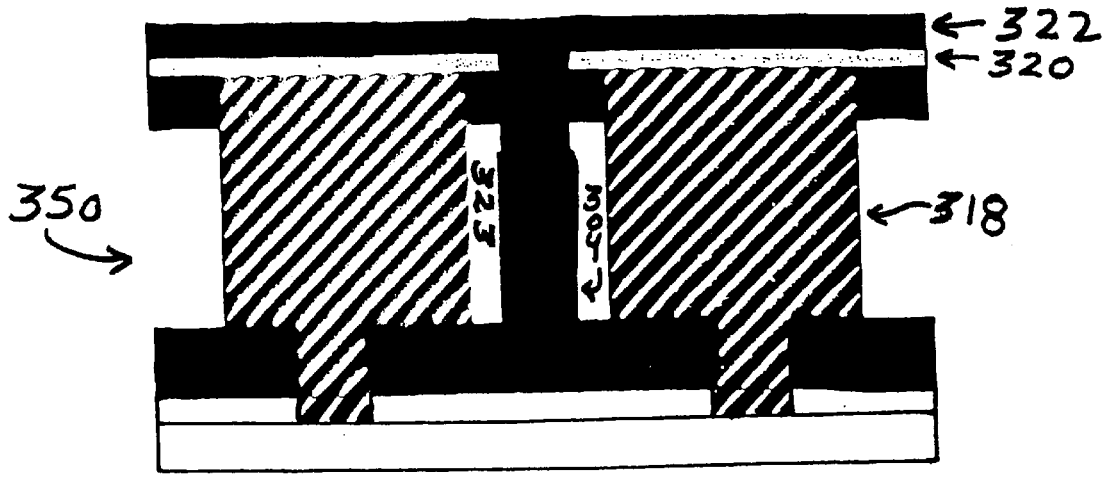
FIG. 3 illustrates a cross-section of a third embodiment of the semiconductor device of the present invention.

FIG. 3 illustrates a cross-section of a third embodiment of the semiconductor device of the present invention. That embodiment is similar to those described above, except for the presence of gap 323, which is formed between pillar 304 and lines 318, and the presence of insulating layer 322. Insulating layer 322 fills a section of barrier layer 320, which was excised to enable layer 105 to be removed to generate gap 323. Gap 323 may be filled with air or another gas, or be a vacuum, depending upon the environment in which device 350 was made. Supporting structure 304 enables device 350 to benefit from the very low-k dielectric that results from gap 323's presence, as it serves to support the insulating layer that lies above it.

Each of these embodiments represents a semiconductor device that includes a dual damascene interconnect, in which the dielectric that separates conductive lines has a low dielectric constant, but also provides acceptable mechanical strength. The pillar, which is separated from the conductive lines by a low-k insulating layer or air filled gap, provides the resulting structure with the desired mechanical strength, without significantly increasing the dielectric's dielectric constant.

Figure 4A:
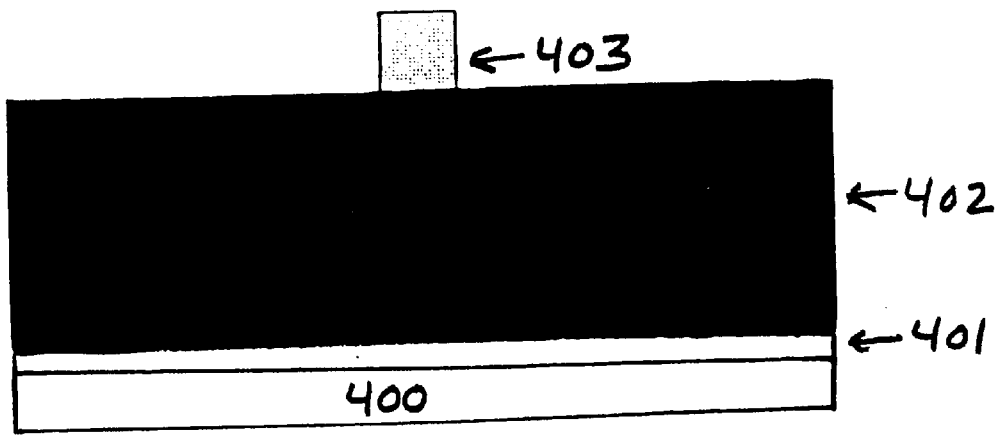
FIGS. 4a–4l illustrate cross-sections that reflect structures that may result when making a semiconductor device in accordance with an embodiment of the method of the present invention.

A first embodiment of the method for making a semiconductor device of the present invention is illustrated in FIGS. 4a–4l. With reference to FIG. 4a, barrier layer 401 is formed on substrate 400. Substrate 400 may be any surface, generated when making a semiconductor device, upon which such a barrier layer may be formed. Substrate 400 may include, for example, active and passive devices that are formed on a silicon wafer such as transistors, capacitors, resistors, diffused junctions, gate electrodes, local interconnects, etc . . . Substrate 400 also may include insulating materials (e.g., silicon dioxide, either undoped or doped with phosphorus (PSG) or boron and phosphorus (BPSG); silicon nitride; silicon oxy-nitride; silicon carbide; a carbon doped oxide; or a polymer) that separate such active and passive devices from conductive layers that are formed on top of them, and may include various numbers and/or types of conductive layers.

Barrier layer 401 may serve to prevent an unacceptable amount of copper, or other metal, from diffusing into insulating layer 402. Barrier layer 401 also may act as an etch stop, protecting an underlying conductive layer during via and trench etch and cleaning steps. Barrier layer 401 preferably is made from silicon nitride or silicon carbide, but may be made from other materials that can serve such functions, e.g., silicon oxycarbide or silicon oxynitride, as is well known to those skilled in the art.

A chemical vapor deposition ("CVD") process may be used to form barrier layer 401. Barrier layer 401 should be thick enough to perform its diffusion inhibition and etch stop functions, but not so thick that it adversely affects the device's overall dielectric characteristics. Barrier layer 401 may be planarized, after it is deposited, using a chemical mechanical polishing ("CMP") step.

After forming barrier layer 401, first insulating layer 402 is formed on top of it. In this embodiment of the present invention, first insulating layer 402 preferably comprises an oxide based layer that includes silicon dioxide, silicon oxyfluoride, or a carbon doped oxide. Oxide based layer 402 may be formed on barrier layer 401 using a conventional CVD process. A layer of photoresist is then formed on layer 402 and patterned to form masking member 403, which defines a support structure that will be subsequently created. The photoresist layer may be patterned using conventional photolithographic techniques, such as masking the layer of photoresist, exposing the masked layer to light, then developing the unexposed portions. The resulting structure is illustrated in FIG. 4a.

Figure 4B:
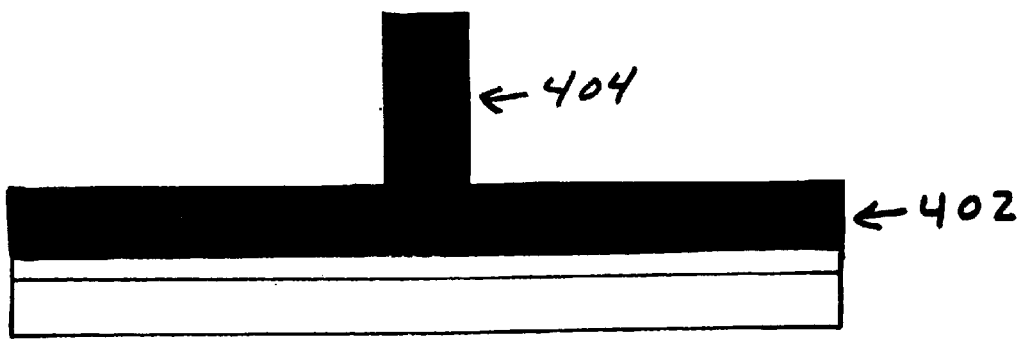

First insulating layer 402 is then etched to generate support structure 404, as shown in FIG. 4b. In this embodiment, support structure 404 takes the form of a pillar, although it may assume many other shapes, e.g., blocks, beams, and various irregular configurations, without departing from the spirit and scope of the present invention. Support structure 404 preferably is less than about 100 nanometers wide. When taking the form of a pillar, support structure 404 will be shaped like a cylinder with a diameter that is preferably less than about 100 nanometers.

Layer 402 may be etched using a conventional plasma etch process, e.g., one that uses fluorocarbon chemistry. A preferred plasma that may be used to perform such an etching step may result from feeding a mixture of $C_4F_8$ (or $C_2F_6$ etc . . . ), oxygen and argon (which may further include carbon monoxide and/or nitrogen) into a conventional plasma etcher. That etcher should be operated long enough to cause the plasma to etch through a significant portion of layer 402, while enabling some of that layer to be retained. (Unless indicated otherwise, the etching steps described in this application reflect anisotropic dry plasma etch processes.)

Parts of the remaining portion of layer 402 may serve to support a subsequently formed conductive line, as described below. Also as described below, a via will be etched through that remaining portion to enable the trench to contact an underlying conductive layer. After layer 402 is etched, photoresist 403 is removed such as by applying a conventional photoresist ashing step, e.g., one that applies an oxygen and nitrogen containing plasma to remove the photoresist. Alternatively, the photoresist may be removed using a forming gas, e.g., one containing hydrogen and nitrogen.

Figure 4C:
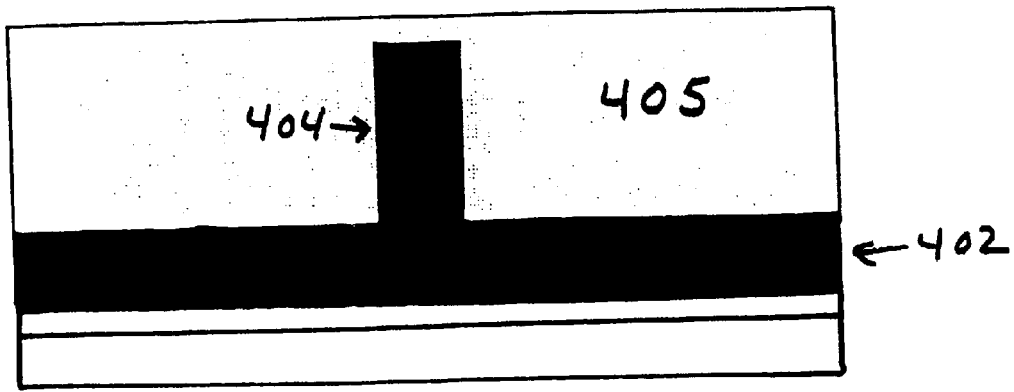

Next, second insulating layer 4Q5 is formed adjacent to pillar 404, producing the FIG. 4c structure. In this embodiment, layer 405 encases pillar 404, covering both its top and its cylindrically shaped shaft. In other embodiments, layer 405 may cover the shaft of pillar 404 without covering the top of it. Either way, the amount of layer 405 that is formed on top of pillar 404 should be minimized, or subsequently removed (e.g., by applying a conventional etch back or CMP step) to prevent that layer from diluting pillar 404's strength enhancing contribution. Second insulating layer 405 has a dielectric constant that is less than the dielectric constant of pillar 404. Layer 405 may comprise a carbon containing material, such as a porous carbon doped oxide or an organic polymer. Suitable polymers may be selected from the group that includes polyimides, parylenes, polyarylethers, polynaphthalenes, polyquinolines, bisbenzocyclobutene, polyphenylene, polyarylene, their copolymers or their porous polymers. Commercially available polymers, e.g., those sold by Honeywell, Inc., under the tradename FLARE™ and by the Dow Chemical Company under the tradenames SiLK™ and CYCLOTENE™, may be used to form layer 405. Such materials may be deposited on the surface of insulating layer 402 and over pillar 404 using a conventional spin on deposition step.

Layer 405 may be made from other materials that may insulate one conductive layer from another, as will be apparent to those skilled in the art. In addition to porous carbon doped oxides and organic polymers, layer 405 may be made from porous fluorine doped oxides, hydrogen silsesquioxane, methyl silsesquioxane, or mesoporous silica. Second insulating layer 405 may be formed from such materials using a conventional CVD or spin on process.

Layer 405 preferably has a dielectric constant that is between about 1.0 and about 3.0. Because of layer 405's low dielectric constant, the capacitance between various conductive elements that are separated by that layer should be reduced, when compared to the capacitance resulting from use of relatively high-k dielectric materials—such as silicon dioxide. By reducing capacitance, the RC delay that would otherwise exist, and undesirable cross-talk between conductive lines, may be decreased.

In this embodiment of the present invention, a dual hard mask is then formed on second insulating layer 405. That hard mask comprises a first hard masking layer 406 that is formed on layer 405 and a second hard masking layer 407 that is formed on first hard masking layer 406. The presence of the dual hard mask enables a via to be etched through both layers 405 and 402, while a trench is etched through layer 405 only. First hard masking layer 406 may comprise silicon dioxide or a carbon doped oxide and second hard masking layer 407 may comprise silicon nitride or silicon carbide, but those layers may be made from other appropriate materials, as is well known to those skilled in the art. Although this embodiment shows layer 407 on top of layer 406, alternative embodiments may form layer 406 on top of layer 407.

Figure 4D:
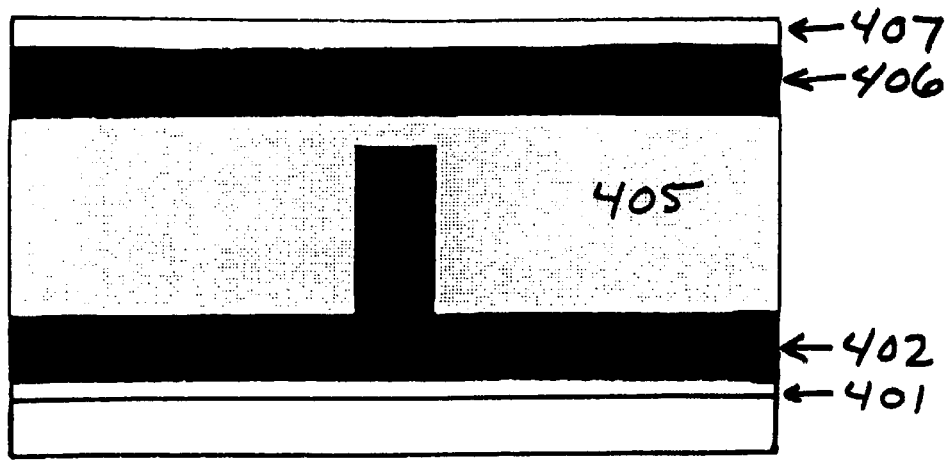

Layers 406 and 407 may be formed using conventional CVD processes. Hard masking layer 407 is preferably made from the same material that was used to form barrier layer 401, but those two layers can be made from different materials. FIG. 4*d* illustrates a cross-section of the structure that results after the dual hard mask is formed on second insulating layer 405.

Figure 4E:
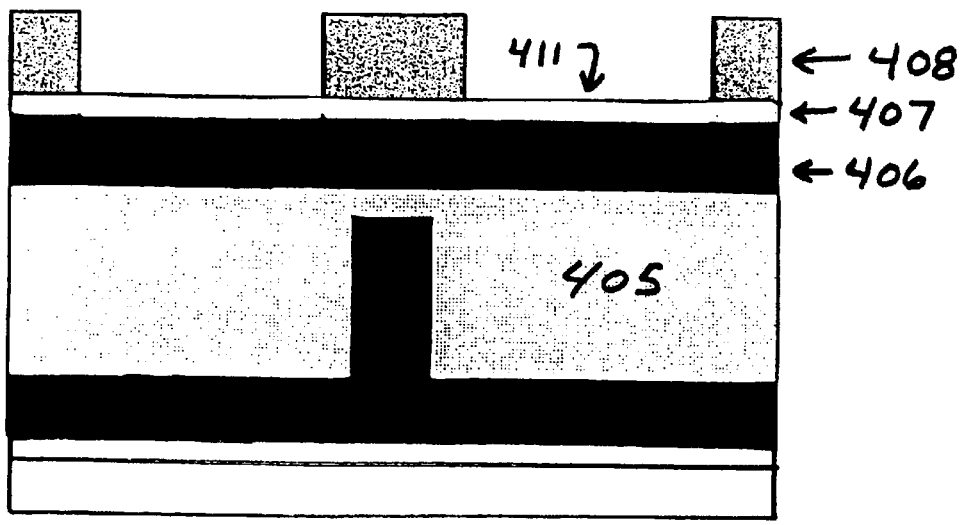

After forming that dual hard mask, a photoresist layer is deposited and patterned on top of it to form masking member 408, which aligns with the underlying pillar and defines a trench that will be formed by removing part of layer 405. The patterned photoresist leaves exposed part 411 of second hard masking layer 407, as shown in FIG. 4*e*. Exposed part 411 is then etched. A plasma that may be used to perform that etch step may result from feeding a mixture of $CH_2F_2$, oxygen, and argon into a plasma etcher. That etcher should be operated long enough to cause the plasma to etch through hard mask 407, then stop on hard mask 406.

Figure 4F:
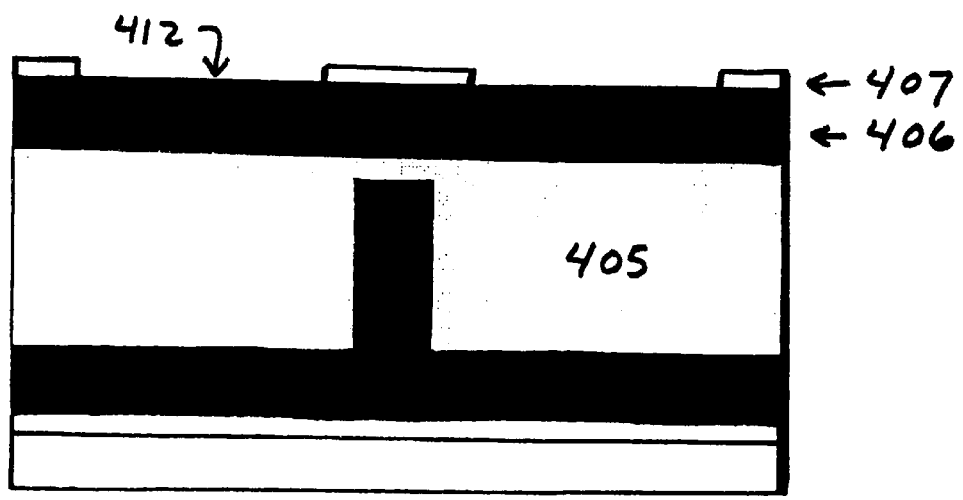

After that etch step, photoresist 408 is removed. First hard masking layer 406 protects second insulating layer 405 during that photoresist removal step. The resulting structure is shown in FIG. 4*f*, in which part 412 of first hard asking layer 406 is no longer protected by layer 407.

Figure 4G:
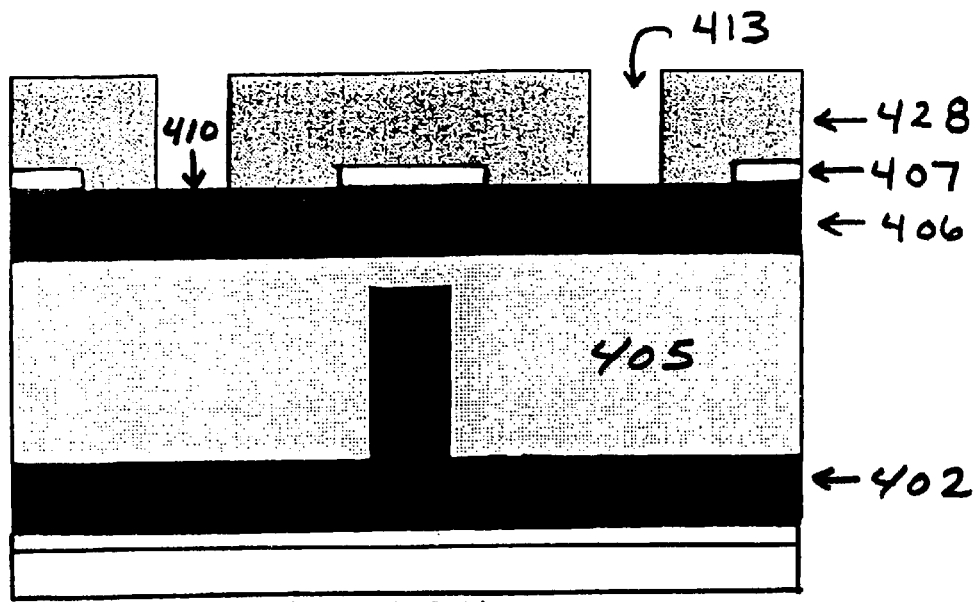
Figure 4H:
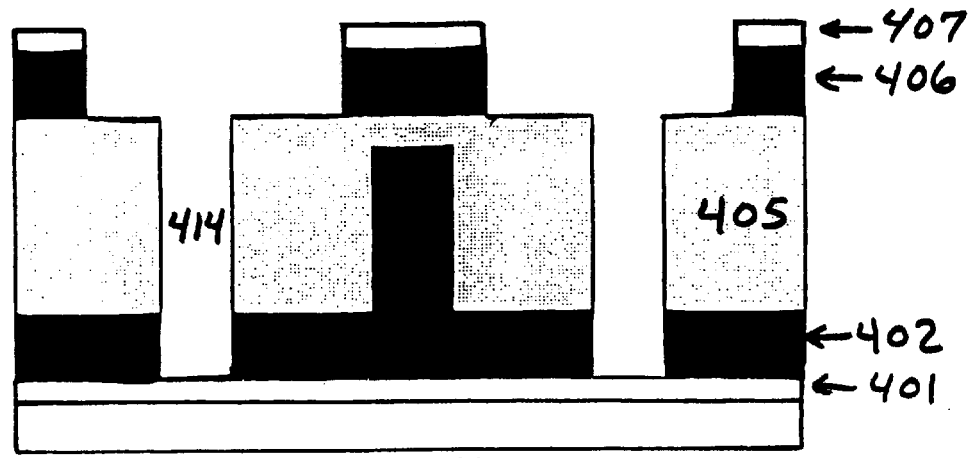
Figure 4I:
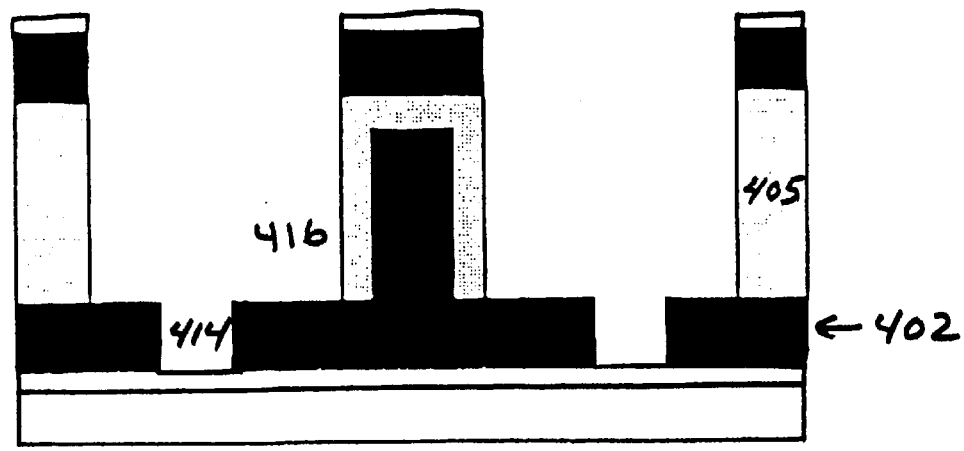
Figure 4J:
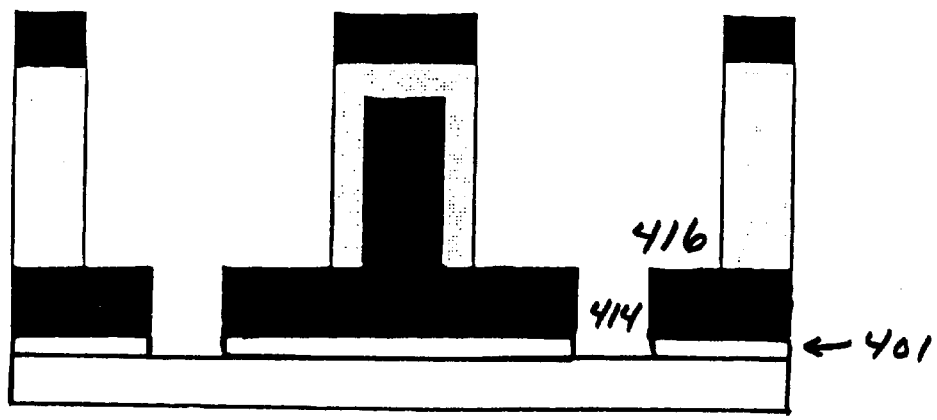

A second layer of photoresist is then deposited and patterned to form masking member 428, which defines the via to be formed by removing part of layer 405 and part of layer 402. When patterned, section 410 of part 412 is exposed, as shown in FIG. 4*g*. Although that figure shows proper alignment of opening 413 with part 412, the patterned photoresist may be misaligned with respect to part 412 (e.g., partially overlapping part 412 and partially overlapping hard mask 407), without any adverse impact. As long as some of part 412 is aligned with opening 413, an acceptable trench and via structure may ultimately result.

After masking member 428 is formed, via 414 and trench 416 are created. When layer 405 comprises an organic polymer, the via and trench may be generated in the following way. First, exposed section 410 is etched, e.g., by using an appropriate fluorocarbon based plasma, such as one formed from a mixture of $C_4F_8$, oxygen and argon (which may further include carbon monoxide). After exposed section 410 is removed, a first part of via 414 is etched through organic polymer layer 405 until it reaches layer 402. A plasma generated from a mixture of oxygen, nitrogen, and carbon monoxide (or a mixture of hydrogen and nitrogen) may be used to perform that etch step. Using this etch chemistry, photoresist 428 may be removed at the same time the via is etched through layer 405. That process may stop when via 414 reaches layer 402 because of the high selectivity of that etch chemistry to that layer.

After etching via 414 through polymer layer 405, and removing the photoresist, the section of layer 406, which lies above the part of layer 405 that will be removed to form the trench, is removed. A plasma generated by feeding a mixture of $C_4F_8$, carbon monoxide, oxygen, nitrogen and argon into a plasma etcher may be used to remove that section. That process, in addition to removing this section, etches into the exposed part of layer 402—extending via 414 to barrier layer 401 and generating the structure shown in FIG. 4*h*. Trench 416 is then etched through layer 405 to produce the structure illustrated in FIG. 4*i*. The same etch chemistry that was used to etch via 414 through layer 405 may be used to etch trench 416 through that layer. As with that via etch step, the trench etch process will stop when the trench reaches layer 402 because of the high selectivity of that etch chemistry to that layer.

When layer 405 comprises a porous carbon doped oxide, the via and trench may instead be formed in the following manner. Via 414 may be etched through exposed section 410, carbon doped oxide layer 405, and layer 402 until it reaches barrier layer 401. A plasma generated by feeding a mixture of $C_4F_8$, carbon monoxide, oxygen, nitrogen and argon into a plasma etcher may be used to etch via 414 through those layers. Photoresist 428 may then be removed using a conventional oxygen based ashing step, or by exposing it to a forming gas. After removing the photoresist, trench 416 may be formed by removing the remaining section of layer 406 that is not protected by layer 407, and the underlying portion of layer 405, using the same etch chemistry that was used to form the via. The trench etch should be timed to ensure that it stops, when reaching layer 402.

If a composite dielectric layer is used, which comprises a polymer based layer that covers an oxide based layer, the trench may be formed within the relatively soft polymer based layer while the via is formed within the harder oxide based layer. This should enhance the resulting structure's mechanical integrity, rendering it more durable. That property should enable this structure to withstand stresses that will be applied during device fabrication, testing and packaging. Another benefit from using a composite dielectric layer is that the via profile may be preserved during the trench etch process, when the etch chemistry used to etch the trench is highly selective for the polymer based layer over the oxide based layer.

When via 414 and trench 416 are etched, barrier layer 401 acts as an etch stop to protect the underlying substrate. Because of nonuniformity in the thickness of layer 405, and etch variability, an overetch step may be necessary when etching the trench. Because such an overetch step may consume barrier layer 401, that layer should be thick enough to prevent the trench etch step from etching completely through it. In addition, the etch chemistry chosen to etch trench 416 should be highly selective to layer 405 over barrier layer 401 to ensure that the trench etch step will not etch through that layer.

Conventional post etch cleaning steps, e.g., such as a conventional HF in ethylene glycol based wet etch process, may follow the via and trench etch steps, as is well understood by those skilled in the art. Barrier layer 401 protects the underlying substrate from exposure to any solvents used to clean the trench and via. After the trench cleaning step, the portion of barrier layer 401 that lies underneath via 414 may be removed, e.g., to expose an underlying conductive layer. The same process that was used to remove hard masking layer 407, as described above, may be used to remove that portion of barrier layer 401. At the same time, the remainder of hard masking layer 407 may be removed to produce the structure shown in FIG. 4*j*.

Removal of barrier layer 401 may be followed by a short wet etch to clear etch residue from the surface of any underlying conductive layer. If copper is used to make such a conductive layer, that portion of barrier layer 401 should be removed using a copper compatible etch chemistry, before any copper electroplating step is applied to fill via 414 and trench 416.

Following that barrier layer removal step, trench 416 and via 414 are filled with a conductive material to form dual damascene interconnect 417. Dual damascene interconnect 417 includes conductive line 418 and via 419. Via 419 couples line 418 to substrate 400. Interconnect 417 may be made from materials that are conventionally used to form conductive layers for semiconductor devices. Interconnect 417 preferably comprises copper, and preferably is generated by forming a copper layer on underlying barrier and seed layers using a conventional copper electroplating process.

The barrier layer used in such an electroplating process may comprise a refractory material, such as titanium nitride, but may also include an insulating material, such as silicon nitride. Such an insulating barrier layer should be removed from the bottom of the via to allow interconnect 417 to contact any underlying metal. Suitable seed materials for the deposition of copper include copper and nickel. Although copper has been identified as a preferred material for making interconnect 417, that interconnect may be formed from various other materials, which can serve to conduct electricity within a semiconductor device. The use of other conducting materials, which may be used to make a semiconductor device, thus falls within the spirit and scope of the present invention.

When an excess amount of the conductive material used to make dual damascene interconnect 417 is formed on the surface of hard masking layer 406, a CMP step may be applied to remove the excess material and to planarize the surface of interconnect 417. When an electroplating process is used to form interconnect 417 from copper, that CMP step can remove both the excess copper and the underlying barrier layer. When layer 406 comprises silicon dioxide, that layer may provide a CMP stop layer for such a CMP step. When layer 405 is a porous carbon doped oxide, the CMP process may also remove silicon dioxide layer 406, then stop at insulating layer 405.

Figure 4K:
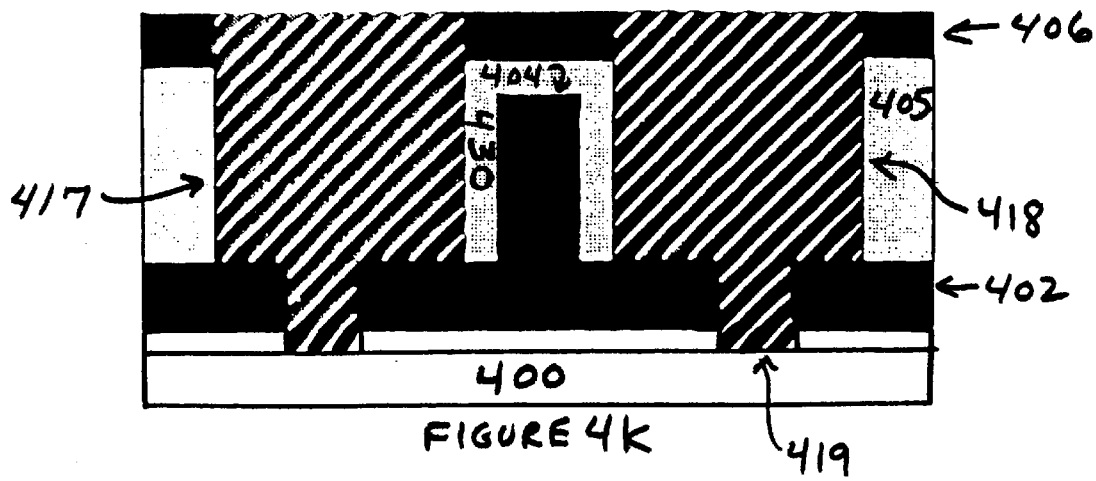

FIG. 4k shows the structure that results after filling trench 416 and via 414 with a conductive material, then applying a CMP step to remove excess material from the surface of layer 406 to produce dual damascene interconnect 417. The remaining portions of layer 402 support line 418, which further strengthens the resulting structure. As shown in FIG. 4k, two conductive lines straddle support structure 404, each separated from that structure by a remaining portion 430 of second insulating layer 405. Remaining portion 430 ensures that the dielectric which separates those conductive lines will have a relatively low dielectric constant, while pillar 404 ensures that the resulting structure will have acceptable mechanical strength.

Following the formation of dual damascene interconnect 417, steps like those described above may be repeated to create a stack of interconnects like those shown in FIG. 4k. In this respect, the process of the present invention may be repeated multiple times, when making the desired semiconductor device. The process begins again by forming second barrier layer 420 on the surface of interconnect 417 to produce the structure shown in FIG. 4l. Barrier layer 420 may be made from the same material used to make barrier layer 401, using the same process equipment and process steps.

FIGS. 5a–5g illustrate cross-sections that reflect structures that may result when making a semiconductor device in accordance with another embodiment of the method of the present invention. This embodiment begins with the structure shown in FIG. 4c, which may be made following the steps described above in connection with FIGS. 4a–4c. Unlike the previous embodiment, however, layer 505 preferably comprises a porous carbon doped oxide, and hard masking layers 406 and 407 are not formed on the surface of layer 505. Instead, a photoresist layer is deposited and patterned directly on top of layer 505 to form masking member 508, which defines a via formation region. After that patterning step, via 514 is etched through layers 505 and 502, e.g., by using a plasma generated from a mixture of $C_4F_8$, carbon monoxide, oxygen, nitrogen and argon, to produce the structure shown in FIG. 5a. Conventional post etch ashing and via clean steps may follow that via etch step.

Figure 5A:
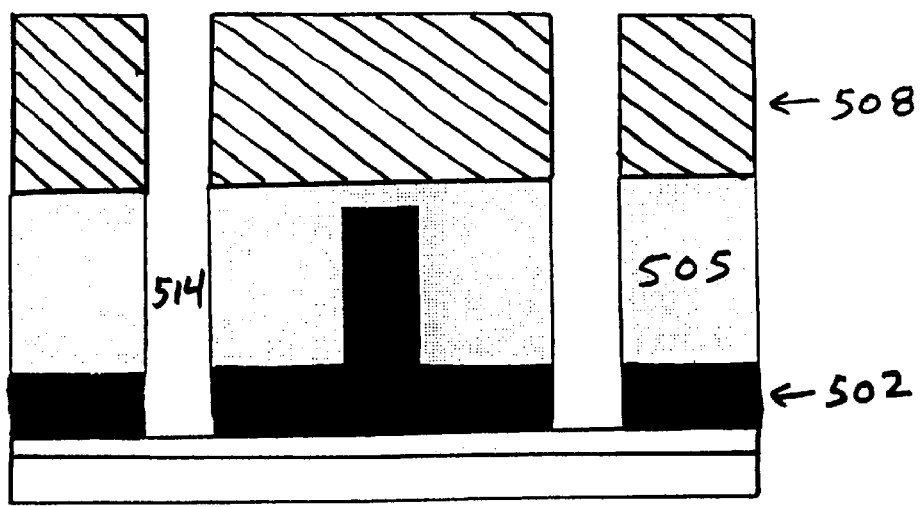
FIGS. 5a–5g illustrate cross-sections that reflect structures that may result when making a semiconductor device in accordance with a second embodiment of the method of the present invention.
Figure 5B:
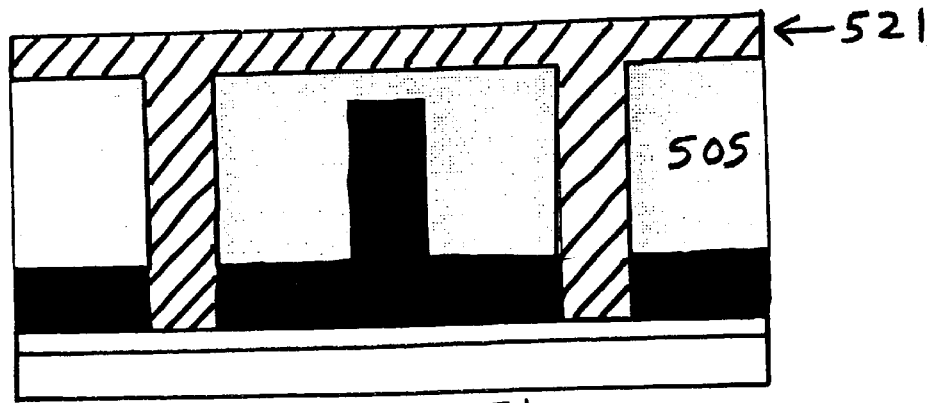

After via 514 is formed through layers 505 and 502, and photoresist 508 is removed, via 514 is filled with sacrificial material 521, generating the structure shown in FIG. 5b. Sacrificial material 521 may comprise a spin-on-glass (SOG) material that is deposited by spin coating it onto the surface of the device, using conventional process steps. Although only a thin layer remains on the surface of the device, such a spin coating process can cause sacrificial material 521 to substantially, or completely, fill via 514. The uniform fill characteristic minimizes void formation, which could jeopardize the integrity of the filling and/or may expose the underlying barrier layer, for an undesirable extended period of time, to etch chemistry used to form the trench.

Sacrificial material 521 preferably has dry etch properties similar to those of insulating layer 505. Such dry etch properties should enable removal of the sacrificial material at substantially the same rate that layer 505 is removed, when forming the trench. In addition to having dry etch properties like those of layer 505, sacrificial material 521 should have a wet etch rate that is significantly faster than the wet etch rate for layer 505. The selectivity of sacrificial material 521 to the wet etch enables its removal from the surface of the device, as well as from the bottom of via 514, without also removing a significant amount of layer 505.

If sacrificial material 521 is transparent, high substrate reflectivity (and reflectivity variation across devices), which results during the exposure step of the lithographic process used to define the trench, may adversely affect the ability to control a device's critical dimensions ("CDs") and their uniformity. That effect may become more pronounced as those CDs shrink. Consequently, a dyed SOG should be used as sacrificial material 521 to control substrate reflectivity. By dying a SOG base material with certain organic or inorganic substances, that base material may become opaque. By using a dyed base material for sacrificial material 521, changes in substrate reflectivity may be reduced, which may enable the photolithographic process to produce improved results.

The organic or inorganic material chosen for the dye preferably should absorb light that is used during the exposure step of the photolithographic process. Preferably, the quantity and type of light absorbing dye, which is added to the base sacrificial material, should enable appreciable absorption of light having a wavelength identical to that used to expose the photoresist to pattern it. For example, the dye type and amount, and the type of base material, used to form the sacrificial material may be selected and tuned to absorb i-line (e.g., 365 nm), deep ultraviolet (e.g., 248 nm and 193 nm), or shorter, wavelengths.

When selecting the type of dye to add to the SOG, or other sacrificial material, and the amount to add, one should ensure that the resulting composition does not compromise the filling capability of the sacrificial material. In addition, when selecting the dye, and the amount used, one should ensure that the wet etch selectivity of the resulting dyed sacrificial material to layer 505 remains high, and that the dry etch selectivity of the sacrificial material to that layer is close to 1:1.

Dyed SOG materials, which are suitable for use in this embodiment of the present invention, may be made by modifying commercially available SOG products—like those that are available from Honeywell, Inc., or Tokyo Ohka Kogyo Co, Ltd. Modifying such a commercially available SOG product by changing the base solvent used to make it, then selecting an appropriate dye, should enable production of a dyed SOG material that is acceptable for use in this embodiment of the present invention.

Figure 5C:
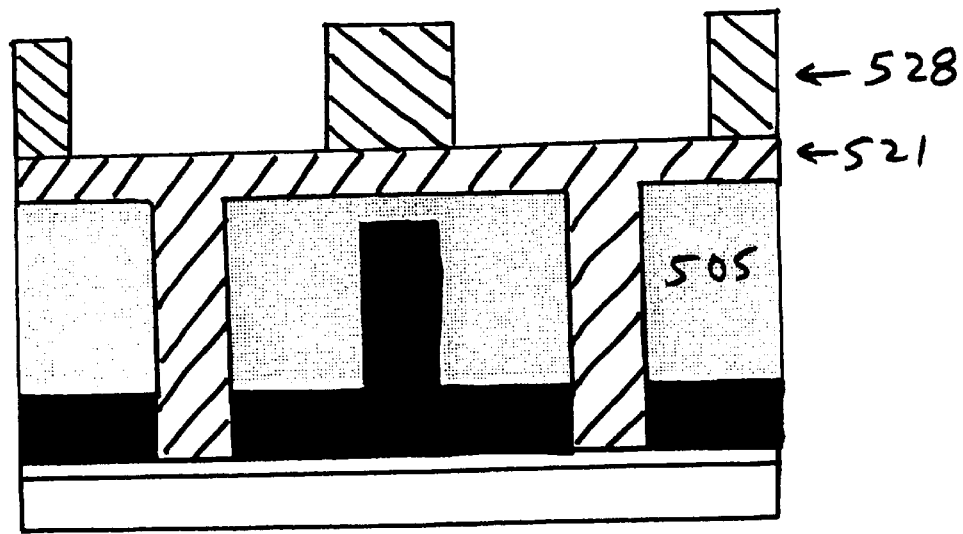
Figure 5D:
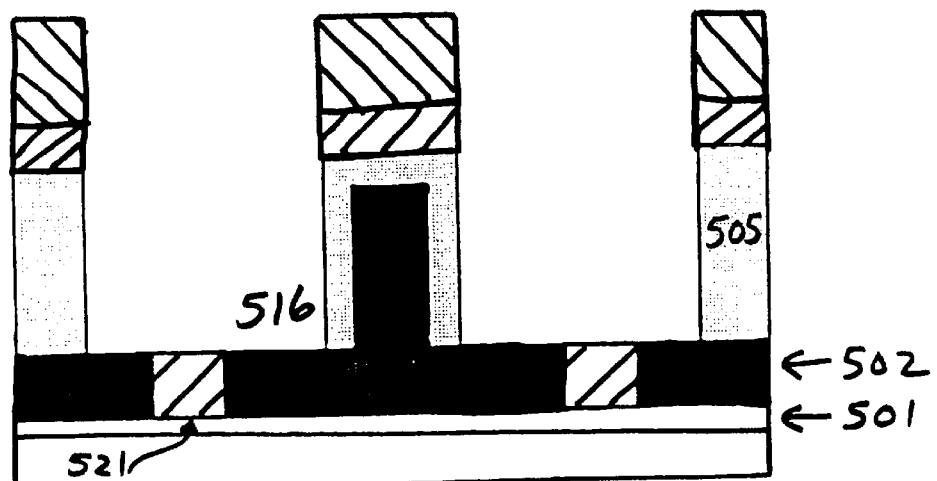
Figure 5E:
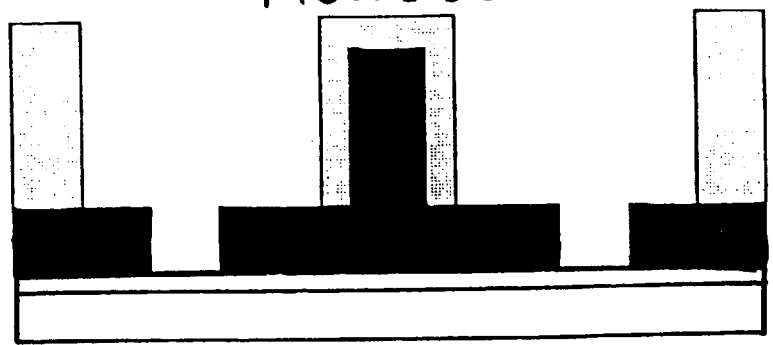
Figure 5F:
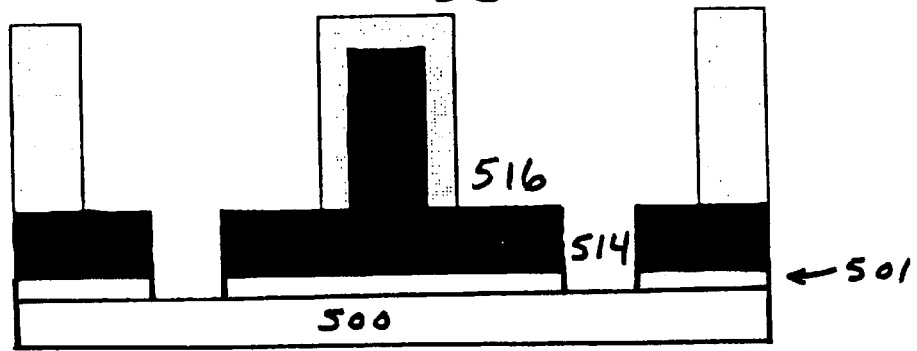
Figure 5G:
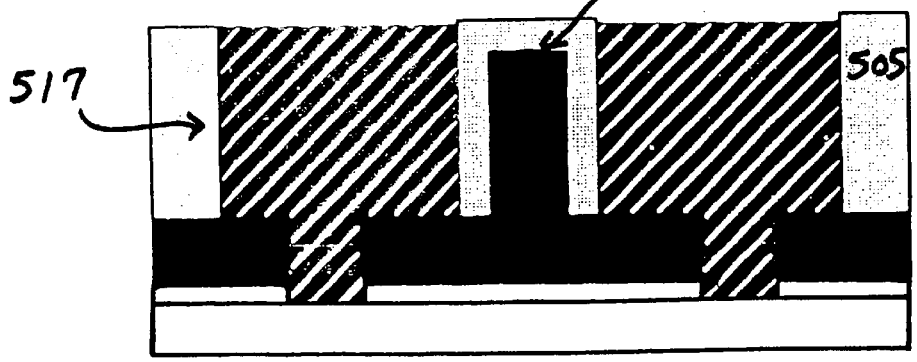

After filling via 514 with sacrificial material 521, a second layer of photoresist is formed and patterned to create masking member 528, which defines the trench to be formed by removing part of layer 505. The resulting structure is shown in FIG. 5c. Following that photoresist patterning step, trench 516 may be etched through insulating layer 505, using an etch chemistry like the one used to etch via 514. The etching process preferably is applied for a time sufficient to cause the trench to etch completely through layer 505, but then stop on layer 502, forming the structure shown in FIG. 5d.

As with the via etch step, barrier layer 501 may act as an etch stop during the trench etching process, protecting an underlying conductive layer from the etch step and any subsequent ashing or cleaning steps. In addition, the presence of any portion of sacrificial material 521 that remains at the bottom of via 514, after the trench etch step, may help ensure that the trench etch process will not adversely affect such a conductive layer.

By filling via 514 with a sacrificial material having dry etch characteristics like those of layer 505, the trench lithography process effectively applies to a substantially "hole-free" surface, similar to one without vias. By selecting an appropriate SOG material for sacrificial material 521, and an appropriate etch chemistry, trench 516 may be etched through layer 505 at a rate that is about as fast as sacrificial material 521 is removed. Such a process protects the underlying barrier layer 501 during the etching of the trench. Such a process thus permits the use of a trench etch chemistry that produces superior trench and via profiles without having to consider the effect such etch chemistry has on the selectivity between layer 505 and barrier layer 501. Because barrier layer 501 is only slightly etched, if at all, during the trench etch process, its thickness may be reduced, which may enhance the resulting device's dielectric properties.

After trench 516 is etched, photoresist 528, and residues that may remain on the device's surface and inside the vias, are removed. Photoresist 528 may be removed using a conventional ashing step or by exposing it to a forming gas. Any remaining portions of sacrificial material 521 may then be removed using a wet etch step that has a significantly higher selectivity for sacrificial material 521 over layer 505. A buffered oxide etch or HF based process, or an etch process based on various amine based materials, may be used—depending upon the substance used for sacrificial material 521, and the material used for layer 505. Irrespective of the chemistry chosen for the wet etch, high selectivity between the sacrificial material and the insulating layer must be maintained. Removal of photoresist 528 and the remainder of sacrificial material 521 generates the structure shown in FIG. 5e.

After that cleaning step, the portion of barrier layer 501 that separates via 514 from substrate 500 may be removed, as described above in connection with FIG. 4j. Removal of barrier layer 501 produces the structure shown in FIG. 5f. Following that barrier layer removal step, trench 516 and via 514 are filled with a conductive material, upon which a CMP step may be applied, to form dual damascene interconnect 517. Process steps like those described above in connection with FIG. 4k may be used to produce the structure shown in FIG. 5g. (In alternative embodiments, the CMP step may remove all of layer 505, where located on top of pillar 504, to optimize the mechanical strength enhancing contribution that pillar 504 provides.) Like the embodiment described above in connection with FIGS. 4a–4l, this sequence of steps may be repeated several times to make the desired semiconductor device.

This embodiment of the present invention may be modified to accommodate the use of an organic polymer to form layer 505 by forming a hard mask on the surface of that layer to protect it from photoresist removal steps. When a polymer is used to form that layer, a spin on polymer, instead of an SOG, may be used to make sacrificial material 521, and the via and trench may be formed using processes like those described above, in connection with FIGS. 4a–4l, for etching those regions through a polymer layer.

Figure 6A:
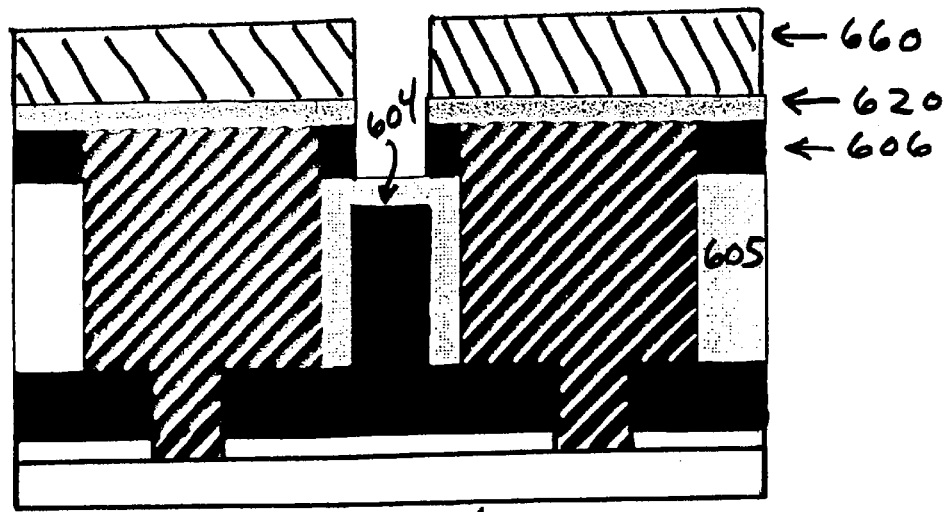
FIGS. 6a–6c illustrate cross-sections that reflect structures that may result when making a semiconductor device in accordance with a third embodiment of the method of the present invention.
Figure 6B:
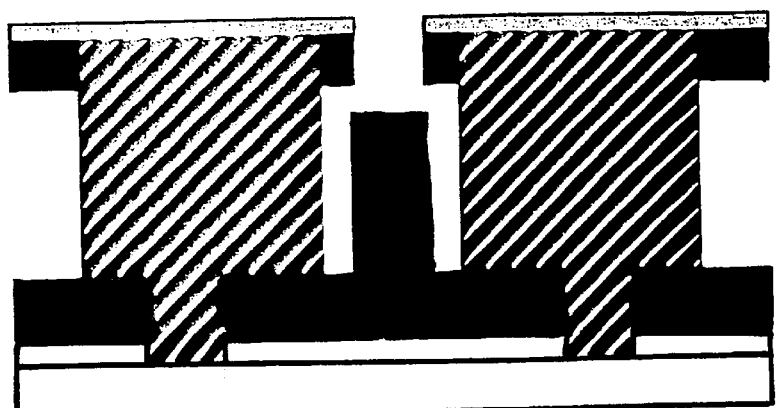
Figure 6C:
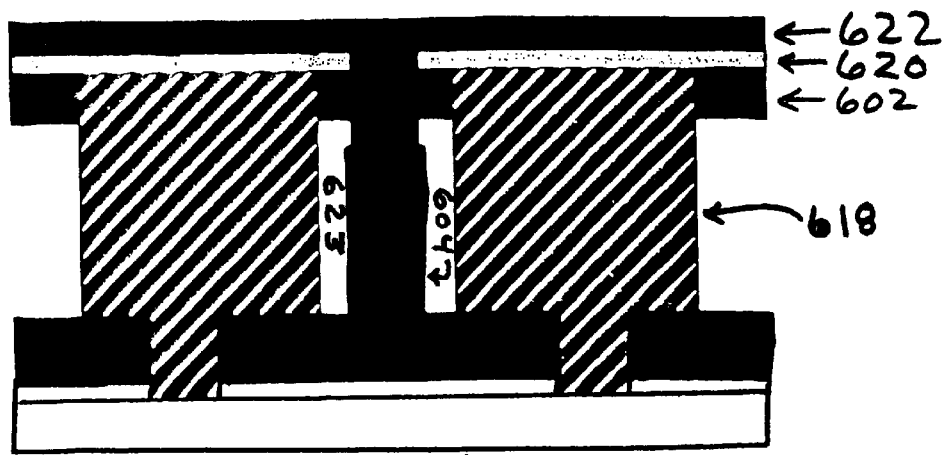

FIGS. 6a–6c illustrate a variation of the process described above in connection with FIGS. 4a–4l. In this variation, layer 605 preferably comprises an organic polymer. Unlike the embodiments described above, layer 605, where located on top of pillar 604, should be relatively thick to facilitate removal of layer 605, where located between pillar 604 and lines 618, using the process steps described below. Following the formation of the structure shown in FIG. 4l, the section of barrier layer 620 that lies above pillar 604 is exposed, while the remaining portions of layer 620 are masked by photoresist 660. Where exposed above pillar 604, layers 620 and 606 are etched down to the surface of layer 605, e.g., by applying a nonselective plasma etch process that uses a plasma made from a mixture of $C_4F_8$, oxygen and argon. The structure shown in FIG. 6a results.

Next, a high pressure, high temperature isotropic etch, which preferably uses a plasma generated from a mixture of oxygen and nitrogen, or a forming gas that includes hydrogen and nitrogen, is applied to remove a substantial portion of layer 605. In a preferred embodiment, substantially all of that layer is removed. Photoresist 660 and layer 605 may be removed at the same time to produce a structure like the one shown in FIG. 6b. Insulating layer 622 may then be formed on the surface of barrier layer 620. Layer 622 preferably is made from silicon dioxide, silicon oxyfluoride, or a carbon doped oxide—using conventional CVD or spin on processes. In addition to covering barrier layer 620, layer 622 fills the hole that had been etched through layers 620 and 606 to enable removal of layer 605, as shown in FIG. 6c. In an alternative embodiment, layer 622 may be thick enough, as deposited, to serve as the layer from which another support structure is formed, providing the foundation upon which another dual damascene interconnect may be made.

The resulting structure includes a gap 623 between conductive line 618 and pillar 604. That gap, which may be filled with air or another gas, or may be a vacuum, depending upon the environment in which the device is made, serves to dramatically lower the dielectric constant for the region that separates conductive lines. At the same time, pillar 604 provides the necessary structural support for the device without significantly increasing the dielectric constant. As a result, this, process yields a device with a very low-k dielectric that has acceptable mechanical strength.

In this embodiment of the present invention, layer 605 may be considered a sacrificial material. This embodiment is not limited to making dual damascene interconnects, but may apply in other contexts where a dielectric is formed to separate conductive regions. In this regard, any process that follows these steps to form a sealed gap between a support structure and a conductive region falls within the spirit and scope of the present invention.

An improved semiconductor device, and method for making it, has been described. Features shown in the above referenced drawings are not intended to be drawn to scale, nor are they intended to be shown in precise positional relationship. Additional features and steps that may be included in the above described semiconductor device, and method for making it, have been omitted as they are not useful to describe aspects of the present invention. Although the foregoing description has specified certain steps, materials, and equipment that may be used to make a semiconductor device in accordance with the present invention, those skilled in the art will appreciate that many modifications and substitutions may be made. For example, although the described embodiments form a dual damascene interconnect for such a device by applying via lithography and trench lithography in a particular order, that order may be reversed in any of those examples. It is further intended that any other modifications, alterations, substitutions and additions, which may be made to the example embodiments described above, be considered to fall within the spirit and scope of the invention as defined by the appended claims.

What is claimed is:

1. A method of forming a semiconductor device comprising:
   forming a support structure on a substrate, the support structure having a first dielectric constant;
   forming adjacent to the support structure a low-k insulating layer, the low-k insulating layer having a second dielectric constant, the second dielectric constant being less than the first dielectric constant;
   removing a first part of the low-k insulating layer to form a via;
   removing a second part of the low-k insulating layer to form a trench; and
   filling the trench and the via with a conductive material, generating a dual damascene interconnect comprising a conductive line, wherein the conductive line is spaced from the support structure;
   wherein the support structure is formed by:
      forming a barrier layer on the substrate;
      forming a first insulating layer on the barrier layer;
      forming on the first insulating layer a layer of photoresist and then patterning the photoresist layer to define the support structure; and
      removing a first part of the first insulating layer to form the support structure;
   wherein the low-k insulating layer is formed on the remaining portion of the first insulating layer;
   wherein the via and trench are formed by removing a first part of the low-k insulating layer and a second part of the first insulating layer to form the via, and by removing a second part of the low-k insulating layer to form the trench; and
   wherein the trench and the via are filled with the conductive material such that the conductive line contacts the remaining portion of the first insulating layer; and
   further comprising removing a substantial part of the remaining portion of the low-k insulating layer to create a gap between the conductive line and the support structure.

2. A method of forming a semiconductor device comprising:
   forming a support structure on a substrate, the support structure having a first dielectric constant;
   forming adjacent to the support structure a low-k insulating layer, the low-k insulating layer having a second dielectric constant, the second dielectric constant being less than the first dielectric constant;
   removing a first part of the low-k insulating layer to form a via;
   removing a second part of the low-k insulating layer to form a trench; and
   filling the trench and the via with a conductive material, generating a dual damascene interconnect comprising a conductive line, wherein the conductive line is spaced from the support structure;
   wherein the support structure is formed by:
      forming a barrier layer on the substrate;
      forming a first insulating layer on the barrier layer;
      forming on the first insulating layer a layer of photoresist and then patterning the photoresist layer to define the support structure; and
      removing a first part of the first insulating layer to form the support structure;
   wherein the low-k insulating layer is formed on the remaining portion of the first insulating layer;
   wherein the via and trench are formed by removing a first part of the low-k insulating layer and a second part of the first insulating layer to form the via, and by removing a second part of the low-k insulating layer to form the trench; and
   wherein the trench and the via are filled with the conductive material such that the conductive line contacts the remaining portion of the first insulating layer; and
   wherein the remaining portion of the low-k insulating layer fills the space between the conductive line and the support structure.

3. A method of forming a semiconductor device comprising:
   forming on a substrate a pillar that comprises a material that is selected from the group consisting of silicon dioxide, silicon oxyfluoride, and carbon doped oxide;
   forming on the substrate adjacent to the pillar a sacrificial material that comprises an organic polymer;
   removing a first portion of the sacrificial material to form a via;
   removing a second portion of the sacrificial material to form a trench;
   filling the trench and the via with a conductive material, generating a dual damascene interconnect comprising a conductive line;
   removing a substantial portion of the remaining sacrificial material, creating a gap between the conductive line and the pillar; and
   forming an insulating layer on top of the pillar and the conductive line.

4. The method of claim 3 wherein substantially all of the remaining sacrificial material is removed and wherein the gap is filled with air.

5. The method of claim 4 wherein the insulating layer comprises a material that is selected from the group consisting of silicon dioxide, silicon oxyfluoride, and carbon doped oxide.

6. The method of claim 5 further comprising forming a barrier layer on top of the conductive line prior to removing the remaining sacrificial material.

7. A method of forming a semiconductor device comprising:

forming an insulating pillar on a substrate;

forming on the substrate adjacent to the pillar a low-k insulating layer;

forming a first hard masking layer on the insulating layer;

forming a second hard masking layer on the first hard masking layer;

depositing a first layer of photoresist and then patterning it to expose part of the second hard masking layer to define a trench to be formed by removing a second portion of the insulating layer;

etching through the exposed part of the second hard masking layer to expose part of the first hard masking layer;

depositing a second layer of photoresist and then patterning it to expose a section of the exposed part of the first hard masking layer to define a via to be formed by removing a first portion of the insulating layer;

etching through the exposed section to expose the first portion of the insulating layer;

removing the first portion of the insulating layer to form the via;

etching through the exposed part of the first hard masking layer to expose the second portion of the insulating layer;

removing the second portion of the insulating layer to form the trench; and filling the trench and the via with a conductive material, generating a dual damascene interconnect comprising a conductive line, wherein the remaining portion of the insulating layer spaces the conductive line from the support structure.

8. A method of forming a semiconductor device comprising:

forming an insulating pillar on a substrate;

forming on the substrate adjacent to the pillar a low-k insulating layer;

forming on the insulating layer a first layer of photoresist and then patterning it to define a via to be formed by removing a first portion of the insulating layer;

removing the first portion of the insulating layer to form the via;

filling the via and covering the insulating layer with a sacrificial material;

forming on the sacrificial material a second layer of photoresist and then patterning it to define a trench to be formed by removing a second portion of the insulating layer;

removing the sacrificial material and the second portion of the insulating layer to form the trench; and filling the trench and the via with a conductive material, generating a dual damascene interconnect comprising a conductive line, wherein the remaining portion of the insulating layer spaces the conductive line from the support structure.

* * * * *

UNITED STATES PATENT AND TRADEMARK OFFICE
CERTIFICATE OF CORRECTION

PATENT NO.   : 6,448,177 B1
DATED        : September 10, 2002
INVENTOR(S)  : Morrow et al.

Page 1 of 1

It is certified that error appears in the above-identified patent and that said Letters Patent is hereby corrected as shown below:

Title page,
Item [73], Assignee, delete "Intle", insert -- Intel --.

Column 4,
Line 25, delete "4Q5", insert -- 405 --.

Figure 4L:
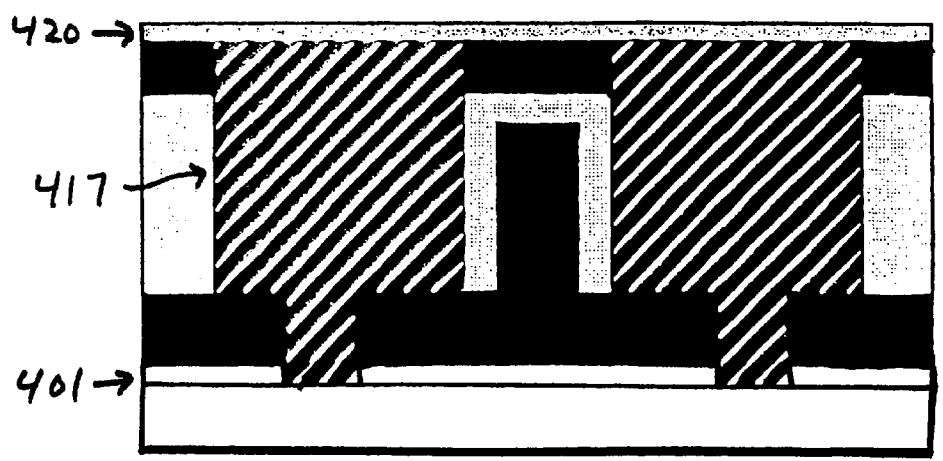

Column 7,
Line 64, delete "FIG. 4 1", insert -- FIG. 4l --.

Signed and Sealed this

Eighteenth Day of February, 2003

JAMES E. ROGAN
*Director of the United States Patent and Trademark Office*